United States Patent
Oh et al.

(10) Patent No.: US 7,372,090 B2
(45) Date of Patent: May 13, 2008

(54) MAGNETIC RANDOM ACCESS MEMORY DEVICE AND METHOD OF FORMING THE SAME

(75) Inventors: Se-Chung Oh, Yonin-si (KR);
Jang-Eun Lee, Suwon-si (KR);
Jun-Soo Bae, Hwaseong-si (KR);
Hyun-Jo Kim, Hwaseong-si (KR);
Kyung-Tae Nam, Suwon-si (KR);
Young-Ki Ha, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 132 days.

(21) Appl. No.: 11/347,280

(22) Filed: Feb. 6, 2006

(65) Prior Publication Data
US 2006/0174473 A1    Aug. 10, 2006

(30) Foreign Application Priority Data
Feb. 7, 2005   (KR)   ................. 10-2005-0011294

(51) Int. Cl.
*H01L 29/76*   (2006.01)
*H01L 29/94*   (2006.01)
*H01L 31/062*  (2006.01)
*H01L 31/113*  (2006.01)
*H01L 31/119*  (2006.01)

(52) U.S. Cl. ............... 257/295; 257/296; 257/288; 257/760; 257/E21.006; 257/E21.082; 257/E21.208; 257/E21.665; 257/E21.293

(58) Field of Classification Search ........... 257/295, 257/296, 288, 421, 635, 760, 761, 762, 763, 257/764, 765, 766
See application file for complete search history.

(56) References Cited

U.S. PATENT DOCUMENTS
5,665,478 A * 9/1997 Suzuki et al. .......... 428/611
(Continued)

FOREIGN PATENT DOCUMENTS
JP    10-313138    11/1998
(Continued)

*Primary Examiner*—David Nhu
(74) *Attorney, Agent, or Firm*—Harness, Dickey & Pierce, P.L.C.

(57) ABSTRACT

Example embodiments of the present invention disclose a semiconductor memory device and a method of forming a memory device. A semiconductor memory device may include a digit line disposed on a substrate, an intermediate insulating layer covering the digit line, a magnetic tunnel junction (MTJ) pattern disposed on the intermediate insulating layer and over the digit line, the MTJ pattern including a sequentially stacked lower magnetic pattern, upper magnetic pattern, and capping pattern, wherein the capping pattern does not react with the upper magnetic pattern at a temperature above about 280° C., and a bit line connected to the capping pattern and disposed to intersect the digit line. A method of forming a semiconductor memory device may include forming a digit line on a substrate, forming an intermediate insulating layer covering the digit line, forming a magnetic tunnel junction (MTJ) pattern on the intermediate insulating layer, the MTJ pattern including a sequentially stacked lower magnetic pattern, upper magnetic pattern, and capping pattern, wherein the capping pattern does not react with the upper magnetic pattern at a temperature above about 280° C., performing an annealing operation at a temperature of about 350° C. or higher, and forming a bit line connected to the capping pattern and disposed to intersect the digit line.

12 Claims, 4 Drawing Sheets

U.S. PATENT DOCUMENTS

| | | | |
|---|---|---|---|
| 6,627,253 B2 | 9/2003 | Suzuki et al. | 427/129 |
| 6,916,669 B2 * | 7/2005 | Jones et al. | 438/3 |
| 7,061,795 B2 * | 6/2006 | Oh et al. | 365/158 |
| 7,129,098 B2 * | 10/2006 | Rizzo et al. | 438/3 |
| 7,154,798 B2 * | 12/2006 | Lin et al. | 365/209 |
| 2006/0022237 A1 * | 2/2006 | Byun et al. | 257/295 |

FOREIGN PATENT DOCUMENTS

| | | |
|---|---|---|
| JP | 2004-146688 | 5/2004 |
| KR | 2002-0008182 | 1/2002 |

* cited by examiner

MAGNETIC RANDOM ACCESS MEMORY DEVICE AND METHOD OF FORMING THE SAME

PRIORITY STATEMENT

A claim of priority is made to Korean Patent Application No. 2005-11294 filed on Feb. 7, 2005, the entire contents of which are hereby incorporated by reference.

BACKGROUND OF THE INVENTION

1. Field of the Invention

Example embodiments of the present invention relate to a semiconductor device and a method of forming the same. More particularly, example embodiments of the present invention relate to a magnetic random access memory device and a method of forming the same.

2. Description of the Related Art

A magnetic random access memory (MRAM) device may be considered a novel memory device because of its non-volatile features and high-speed read/write operation capabilities.

In general, a magnetic tunnel junction (MTJ) pattern may be used to store data at a unit cell of an MRAM device. The MTJ pattern may include a stacked lower ferromagnet and upper ferromagnet layers. A magnetization direction of the lower ferromagnet layer may be fixed, but a magnetization direction of the upper ferromagnet layer may be varied by an external magnet filed. Resistance of the MTJ pattern may change depending on the magnetization directions of the lower and upper ferromagnet layers. The MTJ pattern may have lower resistance when the magnetization directions of the lower and upper ferromagnet layers are the same as compared with when the magnetization directions are in opposite directions. By sensing current difference based on variation in the resistance of the MTJ pattern, it may be possible to determine whether the data stored in the unit cell is a logic level "1" or a logic level "0".

If the upper ferromagnet layer is oxidized, magnetoresistance of the MTJ pattern may be degraded, which may result in the malfunction of the MRAM device. Magnetoresistance may be defined as a percentage (%) ratio of a difference between highest and lowest resistance values of the MTJ pattern to the highest resistance value. If magnetoresistance is low, the resistance difference may be reduced, which may degrade the data storage property of the MRAM device. To reduce or prevent the oxidation of the upper ferromagnet layers, a method of forming a tantalum layer on the upper ferromagnet layer has been disclosed.

However, tantalum may react with the upper ferromagnet layer at high temperatures of above about 280° C., which may degrade properties of the upper ferromagnet. Accordingly, magnetoresistance of the MTJ pattern may be degraded, which may cause failure of the MRAM device. Therefore, it may be necessary to perform MRAM device manufacturing processes at low temperatures, which may degrade the temperature margin of the manufacturing processes.

SUMMARY OF THE INVENTION

Example embodiments of present invention provides an MRAM device and a method of forming the MRAM, which may improve a temperature margin in a manufacturing process thereof.

In an example embodiment of the present invention, a semiconductor memory device may include a digit line disposed on a substrate, an intermediate insulating layer may cover the digit line, and a magnetic tunnel junction (MTJ) pattern may be disposed on the intermediate insulating layer and over the digit line. The MTJ pattern may include a sequentially stacked lower magnetic pattern, upper magnetic pattern, and capping pattern, wherein the capping pattern does not react with the upper magnetic upper pattern at a temperature above about 280° C. A bit line may be connected to the capping pattern and disposed to intersect the digit line. The capping layer may be formed of at least one material selected from the group consisting of zirconium, yttrium, and hafnium In another example embodiment of the present invention, a method of forming a semiconductor memory device may includes forming a digit line on a substrate, forming an intermediate insulating layer covering the digit line, and forming a magnetic tunnel junction (MTJ) pattern on the intermediate insulating layer. The MTJ pattern may include a sequentially stacked lower magnetic pattern, tunnel insulating pattern, upper magnetic pattern, and capping pattern, wherein the capping pattern does not react with the upper magnetic pattern at a temperature above about 280° C. The method may further include performing an annealing operation at a temperature of about 350° C. or higher, and forming a bit line connected to the capping pattern and disposed to intersect the digit line. The capping layer may be formed of at least one material selected from the group consisting of zirconium, yttrium, and hafnium.

BRIEF DESCRIPTION OF THE DRAWINGS

The accompanying drawings, which are included to provide a further understanding of example embodiments of the present invention, are incorporated in and constitute a part of the present disclosure. The drawings together with the detail description serve to explain the example embodiments of the present invention. In the drawings.

EXAMPLE EMBODIMENTS OF THE PRESENT INVENTION

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, for example, "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that may be schematic illustrations of idealized embodiments (and intermediate structures) of the present invention. As such, variations from the shapes of the illustrations as a result, for example, of manufacturing techniques and/or tolerances, are to be expected. Thus, the example embodiments of the present invention should not be construed as limited to the particular shapes of regions illustrated herein but may include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
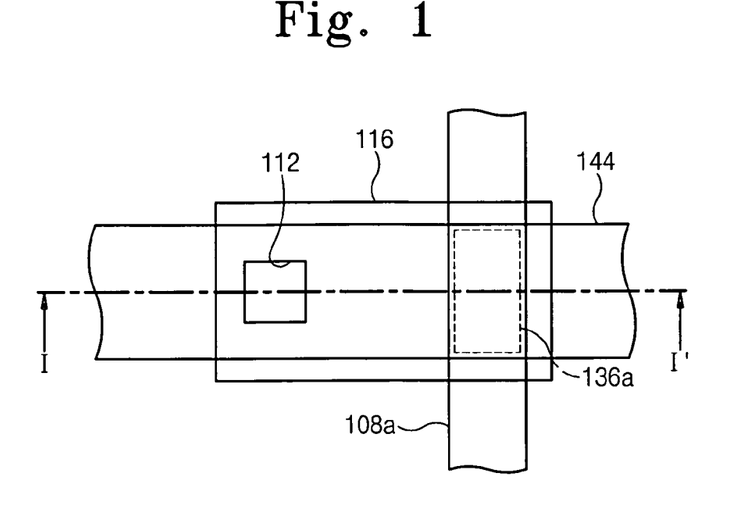
FIG. 1 is a plan view of an MRAM device according to an example embodiment of the present invention.
Figure 2:
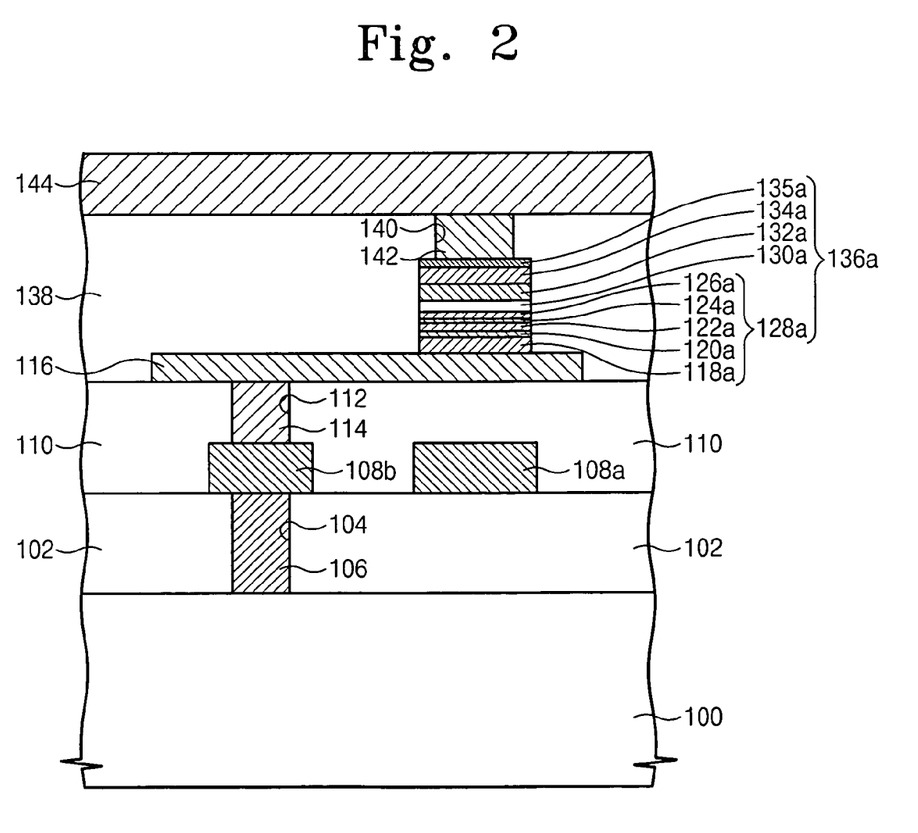
FIG. 2 is a sectional view taken along line I-I' in FIG. 1.

FIG. 1 is a plan view of an MRAM device according to an example embodiment of the present invention, and FIG. 2 is a sectional view taken along line I-I' in FIG. 1.

Referring to FIGS. 1 and 2, a lower insulating layer 102 may be disposed on a substrate 100, and a digit line 108a may be disposed on the lower insulating layer 102. A buffer pattern 108b may be disposed on the lower insulating layer 102 adjacent to the digit line 108a. The digit line 108a and the buffer pattern 108b may be spaced apart from each other. The buffer pattern 108b may be connected to an auxiliary plug 106, and the auxiliary plug 106 may be formed in the lower insulating layer 102. The auxiliary plug 106 may fill an auxiliary contact hole 104 penetrating the lower insulating layer 102. The auxiliary plug 106 may be connected to the substrate 100.

The lower insulating layer 102 may be formed of a silicon oxide layer. The digit line 108a may be formed of conductive material. For example, the conductive material of the digit line 108a may include metal, for example, tungsten, copper, and aluminum. The buffer pattern 108b may be formed of the same material as the digit line 108a. The auxiliary plug 106 may also be formed of a conductive material. For example, the conductive material of the auxiliary plug 106 may include doped polysilicon, or metal, for example, tungsten.

Although not illustrated in the drawings, a MOS transistor may be disposed under the digit line 108a. A gate electrode of the MOS transistor may correspond to a word line, and the word line may be parallel to the digit line 108a. The auxiliary plug 106 may be connected to a source/drain region of the MOS transistor.

An intermediate insulating layer 110 may cover the digit line 108a, the buffer pattern 108b, and the lower insulating layer 102. The intermediate insulating layer 110 may be formed of a silicon oxide layer. An electrode 116 may be formed to cover the digit line 108a and the buffer pattern 108b.

An electrode contact hole 112 may be formed through the intermediate insulating layer 110 to expose the buffer pattern 108b. An electrode plug 114 may fill the electric contact hole 112. An upper surface of the electrode plug 114 may be connected to the electrode 116, and a lower surface thereof may be connected to the buffer pattern 108b.

However, the buffer pattern 108b and the auxiliary plug 106 may be omitted. If omitted, the electrode plug 114 and the electrode contact hole 112 may extend to the lower insulating layer 102. The extended electrode plug 114 may directly connect to the substrate 100. The electrode plug 114 may be formed of conductive material. For example, the conductive material of the line plug 114 may include doped polysilicon, or metal, for example, tungsten, or conductive metal nitride, for example, titanium nitride.

A magnetic tunnel junction (MTJ) pattern 136a may be disposed on the electrode 116. The MTJ pattern 136a may be formed above the digit line 108a. The MTJ pattern 136a may include a stacked lower magnetic pattern 128a, a tunnel insulating pattern 130a, an upper magnetic pattern 132a, and a capping pattern 134a. The MTJ pattern 136a may further include an anti-oxidation conductive pattern 135a disposed on the capping pattern 134a. The lower magnetic pattern 128a may have a fixed magnetization direction. The upper magnetic pattern 132a may be ferromagnetic having varying magnetization directions, whereby the magnetization direction may be varied according to an external magnetic field.

The lower magnetic pattern 128a may include a stacked pinning pattern 118a, a first pinned pattern 122a, a reversing pattern 124a, and a second pinned pattern 126a. The pinning pattern 118a may fix a magnetization direction of the first pinned pattern 122a in a first direction. The first and second pinned patterns 122a and 126a may be ferromagnetic, for example, CoFe, NiFe, or CoFeB. The reversing pattern 124a may fix magnetization direction of the second pinned pattern 126a in a second direction with respect to the fixed magnetization direction of the first pinned pattern 122a. That is, the reversing pattern 124 may cause the first and second pinned patterns 122a and 126a to have opposite magnetization directions.

The first and second pinned patterns 122a and 126a having the fixed magnetization directions may generate a magnetic field. The generated magnetic field may affect the upper magnetic pattern 132a. Because the first and second pinned patterns 122a and 126a have opposite magnetization directions, the generated magnetic field affecting the upper magnetic pattern 132a offset each other. Accordingly, the upper magnetic pattern 132a may not be affected by the generated magnetic field by the first and second pinned patterns 122a and 126a. A distance between the first pinned pattern 122a and the upper magnetic pattern 132a may be greater than a distance between the second pinned pattern 126a and the upper magnetic pattern 132a. Accordingly, the first pinned pattern 122a may be thicker than the second pinned pattern 126a such that the generated magnetic fields offset each other.

The pinning pattern 118a may be anti-ferromagnetic. For example, the pinning pattern 118a may be formed of a material including FeMn, IrMn, PtMn, MnO, MnS, MnTe, MnF2, FeF2, FeCl2, FeO, CoCl2, CoO, NiCl2, NiO, and Cr.

If elements of the pinning pattern 118a diffuse into the first and second pinned patterns 122a and 126a and/or the tunnel insulating pattern 130a, the MTJ pattern 136a may be degraded. To restrain this outward diffusion of elements, the lower magnetic pattern 128a may further include a diffusion barrier pattern 120a interposed between the pinning pattern 118a and the first pinned pattern 122a. The diffusion barrier pattern 120a may restrain the elements from diffusing at high temperatures, for example, above about 350° C. For example, the diffusion barrier pattern 120a may restrain an element, for example Mn, in the pinning pattern 118a from diffusing into the first and second pinned patterns 122a and 126a and/or the tunnel insulating pattern 130a. The diffusion barrier pattern 120a may also restrain other elements in the pinning pattern 118a from outwardly diffusing. The diffusion barrier pattern 120a may be formed of an oxide layer containing cobalt and/or iron. If the diffusion barrier pattern 120a has a high resistance, it may be formed to a small thickness of about 1 Å to 10 Å.

Alternatively, to restrain the outward diffusion of the elements in the pinning pattern 118a, the first pinned pattern 122a may be an amorphous ferromagnet. An amorphous ferromagnet has no grain boundary and thus may restrain the outward diffusion of the elements in the pinning pattern 118a. Similar to the first pinned pattern 122a, the second pinned pattern 126a may be an amorphous ferromagnet. In example embodiments of the present invention, the diffusion barrier pattern 120a may be omitted.

The first and second pinned patterns 122a and 126a may be ferromagnetic. That is, the first and second pinned patterns 122a and 126a may be formed of a single element material, for example, iron (Fe), nickel (Ni), and cobalt (Co), or a compound element material containing at least one of Fe, Ni, and Co. For example, the first and second pinned patterns 122a and 126a may be formed of CoFe, NiFe, or CoFeB. CoFeB is an amorphous ferromagnet. If the first pinned pattern 122a or the first and second pinned patterns 122a and 126a is ferromagnetic, then they may be formed of CoFeB.

The reversing pattern 124a may be formed of ruthenium (Ru), iridium (Ir), or rhodium (Rh).

The tunnel insulating pattern 126a may be formed of a magnesium oxide layer. Alternatively, the tunnel insulating pattern 126a may be formed of an aluminum oxide layer.

The upper magnetic pattern 132a may be ferromagnetic. That is, the upper magnetic pattern 132a may be formed of a single element material, for example, Fe, Ni, and Co, or a compound element material containing Fe, Ni, and Co. For example, the upper magnet pattern 132a maybe formed of CoFe, NiFe, or CoFeB.

The capping pattern 134a may be formed of metal that may be resistant to reacting with the upper magnetic pattern 132a at temperatures of about 350° C. or higher. That is, the capping pattern 134a may be formed of metal that may not be soluble by the upper magnetic pattern 132a at temperatures of about 350° C. or higher. Specifically, the capping pattern 134a may be formed of zirconium (Zr), yttrium (Y), and hafnium (Hf).

The MTJ pattern 136a may be formed at an annealing temperature of above about 350° C. More specifically, the MTJ pattern 136a may be formed at an annealing temperature of about 350° C. to 450° C.

If magnesium oxide layer is used as the tunnel insulating pattern 130a, annealing temperature may be above about 360° C. If the tunnel insulating pattern 130a is formed of the magnesium oxide layer and annealed at temperature above about 360° C., the MTJ pattern 136a may have very-high magnetoresistance (about 230%). Accordingly, a sensing margin of a MRAM cell with the MTJ pattern 136a may be greatly improved. Alternatively, if the tunnel insulating pattern 130a is formed of an aluminum oxide layer, the MTJ pattern 136a has magnetoresistance of about 60%.

The anti-oxidation conductive pattern 135a may reduce and/or minimize oxidation of the capping pattern 134a. If an upper surface of the capping pattern 134a is oxidized, a contact resistance between the MTJ pattern 136a and a bit line 144 may undesirably increase. Accordingly, the anti-oxidation conductive pattern 135a may be stacked on the capping pattern 134a, thereby minimizing oxidation of the capping pattern 134a. The anti-oxidation conductive pattern 135a may be formed of metal that may restrain the oxidation of the capping pattern 134a. For example, the anti-oxidation conductive pattern 135a may be formed of tantalum (Ta) and ruthenium (Ru).

As disclosed above, the capping pattern 134a may be formed of a metal including Zr, Y, and Hf that may be resistant to reacting with the upper magnetic pattern 132a at temperatures of above about 350° C. Accordingly, even if the MTJ pattern 136a is formed by annealing at a temperature of about 350° C. or higher, the reaction between the MTJ pattern 136a and the upper magnetic pattern 132a may be restrained, thereby reducing and/or minimizing the property degradation of the MTJ pattern 136a, particularly the magnetic property of the upper magnetic pattern 132a. Consequently, it may be possible to reduce and/or minimize the malfunction or failure of a MRAM device having a MTJ pattern 136a. Also, it may be possible to improve the temperature margin during a manufacturing process of the MRAM device.

In an example embodiment of the present invention, the electrode 116 may be formed of conductive material. Specifically, the electrode 116 may be formed of conductive metal nitride (e.g., titanium nitride and tantalum nitride) that has very-low reactivity.

An upper insulating layer 138 may be disposed on the substrate 100 having the MTJ pattern 136a. The upper insulating layer 138 may be formed of a silicon oxide layer. A bit line 144 may be disposed on the upper insulating layer 138 to intersect the digit line 108a. The bit line 144 may overlap the MTJ pattern 136a. The MTJ pattern 136a may be disposed between the digit line 108a and the bit line 144. The bit line 144 may be electrically connected to the capping pattern 134a. If the anti-oxidation conductive pattern 135a is interposed, the bit line 144 may directly contact the anti-oxidation conductive pattern 135a and may electrically connect to the capping pattern 134a.

A magnetization direction of the upper magnetic pattern 132a may change due to magnetic fields generated by the digit line 108a and the bit line 144. Accordingly, resistance of the MTJ pattern 136a may vary, and thus a unit cell of the MRAM device may store data "0" or "1". A difference in currents flow between the bit line 144 and the electrode 116 may make it possible to read the data stored in the unit cell of the MRAM device.

As illustrated in the drawings, if the upper insulating layer 138 covers an upper surface of the MTJ pattern 136a, the bit line 144 may be electrically connected to the capping pattern 134a via a line contact hole 140 that penetrates through the upper insulating layer 138. At this point, the line contact hole 140 may be filled with a line plug 142. Alternatively, a portion of the bit line 144 may be extended to fill the line contact hole 140, so that the bit line 144 may directly connect to the capping pattern 134a.

Although not illustrated in the drawings, upper surfaces of the upper insulating layer 138 and the MTJ pattern 136a may be of the same height. That is, the upper insulating layer 138 may be formed to surround sidewalls of the MTJ pattern 135a. In this case, the upper surface of the MTJ pattern 136, that is, an upper surface of the capping pattern 134a) may be exposed, and the bit line 144 may directly connect to the exposed upper surface of the capping pattern 134a.

The bit line 144 may be formed of a conductive layer. For example, the bit line 144 may include metal, for example, tungsten, copper, and aluminum. The line plug 142 may also be formed of conductive material. For example, the line plug 142 may include conductive metal nitride (e.g., titanium nitride and tantalum nitride), or metal (e.g., tungsten and aluminum).

The MTJ pattern 136a may be rectangular in a two-dimensional view. This shape facilitates the arrangement of a magnetization direction of the upper magnetic pattern 132a. That is, the magnetization direction of the upper magnetic pattern 132a may change to be parallel to a longitudinal direction of the MTJ pattern 136a by the magnetic fields generated by the digit line 108a and the bit line 144.

Experiments were performed to ascertain reactive properties of the capping pattern 134a and the upper magnetic pattern 132a. Sample 1 and Sample 2 were prepared. Sample 1 was prepared by sequentially forming a NiFe layer and a conventional tantalum layer on a substrate, and then annealed at different temperatures. In the case of Sample 2, an NiFe layer and a zirconium layer according to an example embodiment of the present invention were sequentially formed on a substrate, and then annealed at different temperatures.

Figure 3:
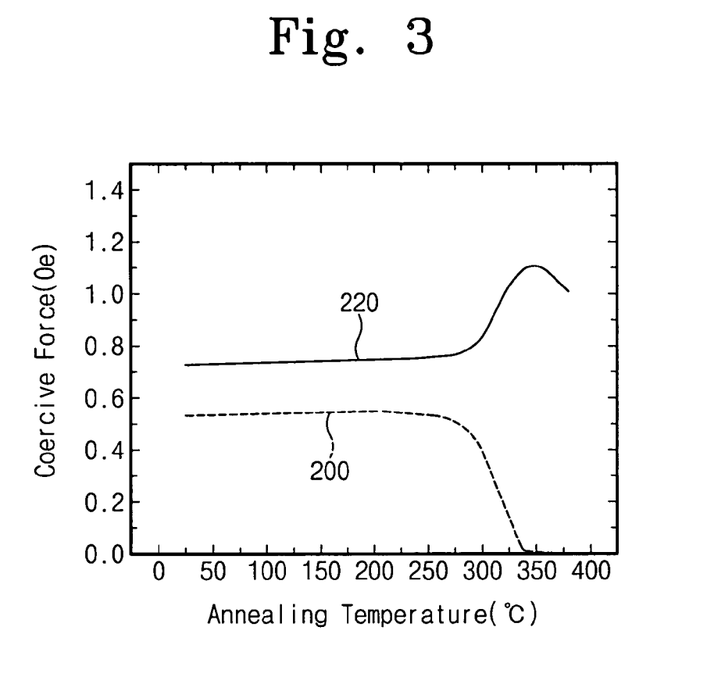
FIG. 3 is a graph illustrating coercive force values depending on annealing temperatures to explain a ferromagnetic property according to an example embodiment of the present invention.
Figure 4:
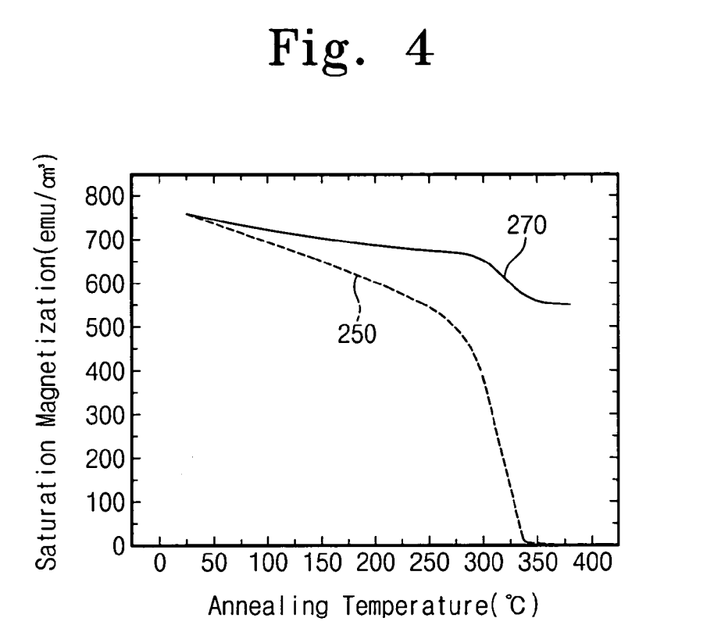
FIG. 4 is a graph illustrating saturation magnetization values depending on the annealing temperatures to explain a ferromagnetic property according to an example embodiment of the present invention.

Coercive force values of the NiFe layers in Samples 1 and 2 with respect to the annealing temperatures are illustrated in FIG. 3, and the saturation magnetization values of the NiFe layers in Samples 1 and 2 with respect to the annealing temperatures are illustrated in FIG. 4.

FIG. 3 is a graph illustrating coercive force values depending on the annealing temperatures, which may be used to explain ferromagnetic properties according to example embodiments of the present invention, and FIG. 4 is a graph illustrating saturation magnetization values depending on the annealing temperatures, which may be used to explain ferromagnetic properties according to example embodiments of the present invention.

Referring to FIG. 3, the X-axis and the Y-axis represent an annealing temperature and a coercive force value, respectively. Dotted line 200 represents data of the NiFe layer of Sample 1, and solid line 220 represents data of the NiFe layer of Sample 2. As can be seen from the dotted line 200, as the annealing temperature increased around about 280° C., the coercive force value of the NiFe layer of Sample 1 rapidly decreased. Thereafter, the coercive force value decreased to "0" at an annealing temperature of about 340° C. Whereas, the coercive force value of the NiFe layer of Sample 2 maintained at a level even at the annealing temperature of 350° C. and greater, as it may be seen from the solid line 220.

Referring to FIG. 4, the X-axis and the Y-axis represent annealing temperature and saturation magnetization value, respectively. Dotted line 250 represents data of the NiFe layer of Sample 1, and solid line 270 represents data of the NiFe layer of Sample 2. As can be seen from the dotted line 250, as the annealing temperature increased from about 270° C., the saturation magnetization value of the NiFe layer in Sample 1 rapidly decreased. Thereafter, the saturation magnetization value decreased to "0" at an annealing temperature of about 340° C. Whereas, the saturation magnetization value of the NiFe layer of Sample 2 was maintained at a level even at an annealing temperature of 350° C. or higher, as it may be seen from the solid line 270.

As described above, the coercive force value and the saturation magnetization value of the NiFe layer in Sample 1 rapidly decreased at an annealing temperature of about 280° C. or higher. Thereafter, the coercive force value and the saturation magnetization value all decreased to "0" at an annealing temperature of about 340° C. It may be implied that the NiFe layer of Sample 1 completely loses its magnetism. That is, the NiFe layer reacts with the tantalum layer at an annealing temperature of about 340° C., and thus loses its magnetism.

On the contrary, the coercive force value and the saturation magnetization value of the NiFe layer of Sample 2 are maintained at values even at annealing temperatures of about 350° C. or higher. Accordingly, the NiFe layer of Sample 2 maintains it magnetism. That is, it may be implied that the NiFe layer resists to reacting with the zirconium layer at annealing temperatures of about 350° C. or higher.

Figure 5:
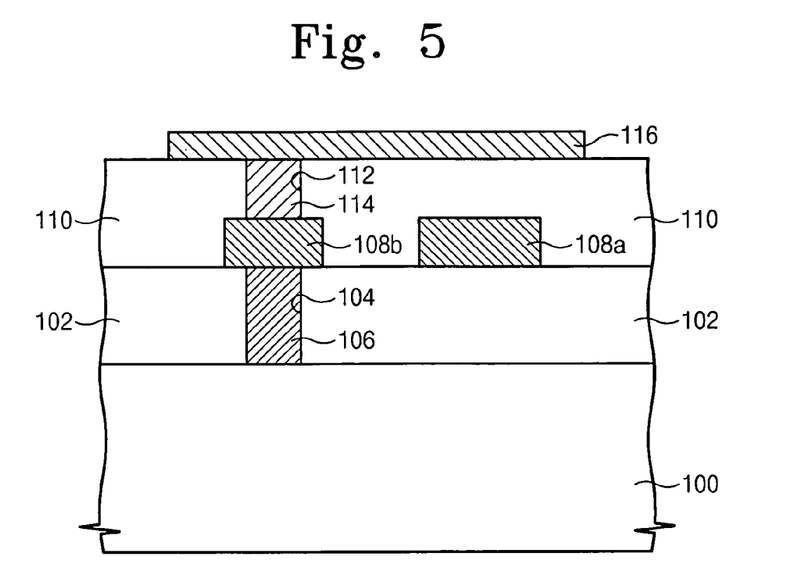
FIGS. 5 through 7 are sectional views taken along line I-I' in FIG. 1 to illustrate a method of forming an MRAM device according to an example embodiment of the present invention.
Figure 6:
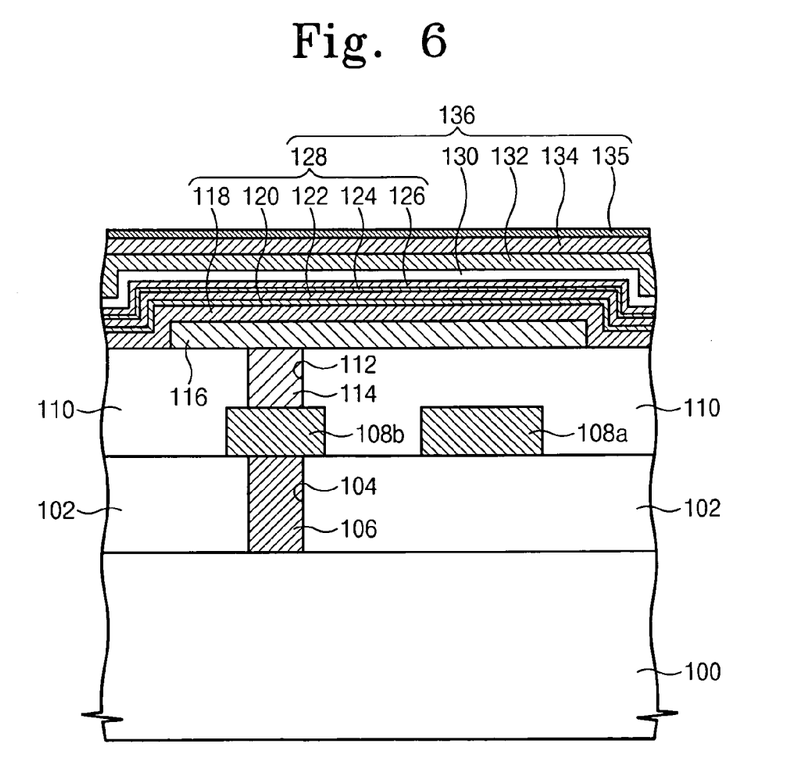
Figure 7:
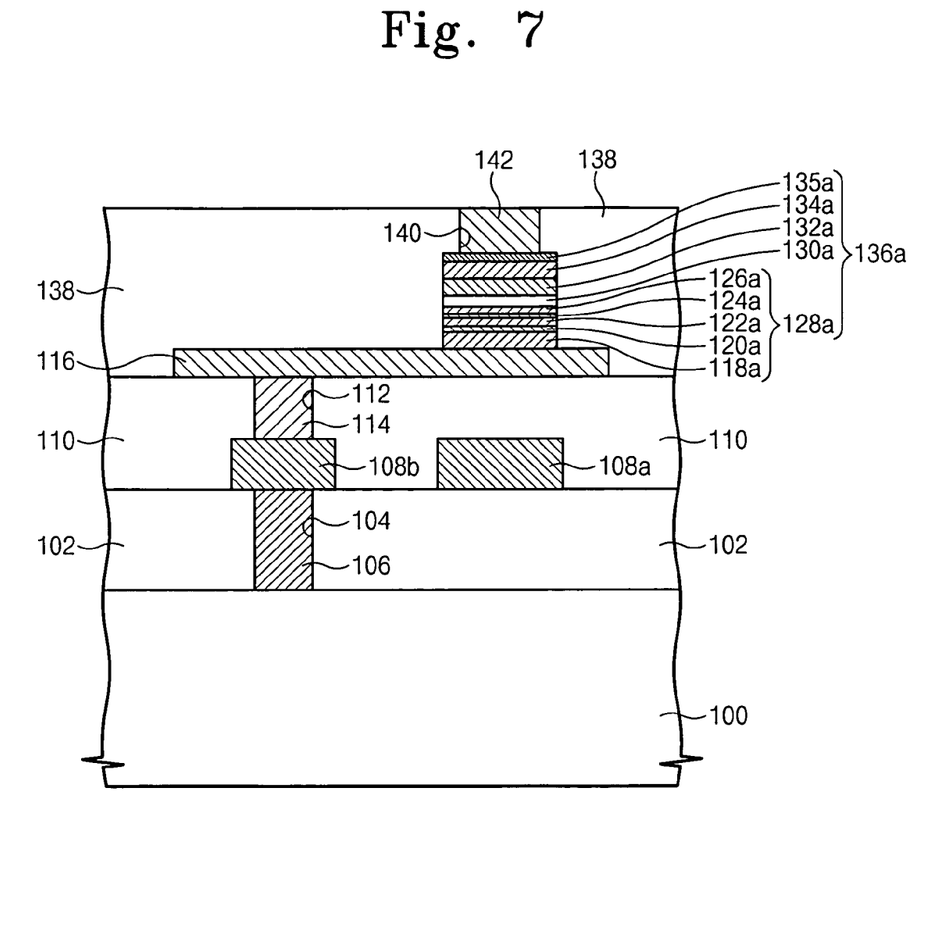

FIGS. 5 through 7 are sectional views that are taken along line I-I' in FIG. 1 to illustrate a method of forming an MRAM device according to example embodiments of the present invention.

Referring to FIG. 5, a lower insulating layer 102 may be formed on a substrate 100. The lower insulating layer 102 may be formed of a silicon oxide layer. The lower insulating layer 102 may be patterned to form an auxiliary contact hole 104 that may expose the substrate 100. Thereafter, an auxiliary plug 106 may be formed to fill the auxiliary contact hole 104. The auxiliary plug 106 may be a conductive layer and may include doped polysilicon, or metal, for example, tungsten.

A digit conductive layer (not shown) may be formed on the lower insulating layer 102. The digit conductive layer may be patterned to form a digit line 108a and a buffer pattern 108b that may be spaced apart from each other. The buffer pattern 108b may be connected to an upper surface of the auxiliary plug 106. The digit line 108 may include metal, for example, tungsten, copper, and aluminum.

Although not illustrated in the drawing, a MOS transistor may be formed on the substrate 100 prior to the formation of the lower insulating layer 102. A gate electrode of the MOS transistor corresponds to a word line. The auxiliary plug 106 may be formed such that it is connected to a source/drain region of the MOS transistor.

Thereafter, an intermediate insulating layer 110 may be formed on the substrate 100 having the digit line 108a and the buffer pattern 108b. The intermediate insulating layer 110 may be formed of a silicon oxide layer. An electrode 116 may be formed to cover the digit line 108a and the buffer pattern 108b. The intermediate insulating layer 110 may be patterned to form an electrode contact hole 112 that exposes the buffer pattern 108b. Thereafter, an electrode plug 114 may be formed to fill the electrode contact hole 112. The electrode plug 114 may be formed of conductive material. For example, the line plug 114 may include doped polysilicon, or metal, for example, tungsten, or conductive metal nitride, for example, titanium nitride.

The formation of the buffer pattern 108b and the auxiliary plug 104 may be omitted. In this case, the intermediate and lower insulating layers 110 and 102 may be sequentially patterned to form the electrode contact hole 112, and the electrode plug 114 may be formed to fill the electrode contact hole 112 that penetrates through the intermediate and lower insulating layers 110 and 102.

An electrode 116 is formed on the intermediate insulating layer 110. The electrode 116 may contact with an upper surface of the electrode plug 114, and is extended sideward to cover the digit line 108a. The electrode 116 may be formed of low-reactivity conductive material. For example, the electrode 116 may be formed of conductive metal nitride, for example, titanium nitride and tantalum nitride.

Referring to FIG. 6, an MTJ layer 136 may be formed on the substrate 100 having the electrode 116. The MTJ layer 136 may include a sequentially stacked lower magnetic layer 128, a tunnel insulating layer 130, an upper magnetic layer 132, and a capping layer 134. The MTJ layer 136 may further include an anti-oxidation conductive layer 135 disposed on the capping layer 134.

The lower magnetic layer 128 may include a sequentially stacked pinning layer 118, a first pinned layer 122, a reversing layer 124, and a second pinned layer 126. The lower magnetic layer 128 may further include a diffusion barrier layer 120 that may be interposed between the pinning layer 118 and the first pinned layer 122. The diffusion barrier layer 120 may restrain outwardly diffusion of elements in the pinning layer 118. The diffusion barrier layer 120 may be formed of an oxide layer containing cobalt and/or iron. When the diffusion barrier layer 120 has a high resistance, it may be formed to a thickness of about 1 Å to 10 Å.

The pinning layer 118 may be formed of material that fixes a magnetization direction of the first pinned layer 122 in a first direction. The pinning layer 118 may be antiferromagnetic. For example, the pinning layer 118 may be formed of FeMn, IrMn, PtMn, MnO, MnS, MnTe, MnF2, FeF2, FeCl2, FeO, CoCl2, CoO, NiCl2, NiO, and Cr.

The first and second pinned layers 122 and 126 may be ferromagnetic. The first pinned layer 122 may be formed to be thicker than the second pinned layer 126. The first pinned layer 122 may be formed of an amorphous ferromagnet to restrain the outwardly diffusion of elements in the pinning layer 118. If the first pinned layer 122 is formed of an amorphous ferromagnet, the diffusion barrier layer 120 may be omitted. Along with the formation of the diffusion barrier layer 120, the first pinned layer 122 may be formed of an amorphous ferromagnet. The second pinned layer 126 may also be formed of an amorphous ferromagnet. The first and second pinned layers 122 and 126 may be formed of a single element material, for example, iron (Fe), nickel (Ni), and cobalt (Co), or a compound element material of Fe, Ni, and Co. For example, the first and second pinned patterns 122a and 126a may be formed of CoFe, NiFe, or CoFeB. CoFeB is an amorphous ferromagnet.

The reversing layer 124 may be formed of a material that fixes a magnetization direction of the second pinned layer 126 in a second direction with respect to a fixed magnetization direction of the first pinned layer 122. For example, the reversing layer 124 may be formed of a material of ruthenium (Ru), iridium (Ir), and rhodium (Rh).

The tunnel insulating layer 132 may be formed of a magnesium oxide layer. Alternatively, the tunnel insulating layer 126 may be formed of an aluminum oxide layer.

The upper magnetic layer 132 may be ferromagnetic. That is, the upper magnetic layer 132 may be formed of a single element material of Fe, Ni, and Co, or a compound element material, for example, the upper magnet layer 132 maybe formed of CoFe, NiFe, or CoFeB.

The capping layer 134 may be formed of metal that resists to reacting with the upper magnetic layer 132 at a temperature about 350° C. or higher. Specifically, the capping layer 134 may be formed of metal that that resists to reacting with the upper magnetic layer 132 at a temperature between about 350° C. to 450° C. The capping layer 134 may be formed of zirconium (Zr), yttrium (Y), and hafnium (Hf).

The anti-oxidation conductive layer 135 may be formed of metal that may prevent oxidation of the capping layer 134. For example, the anti-oxidation conductive layer 135 may be formed of tantalum (Ta) and ruthenium (Ru).

The substrate 100 having the MTJ layer 136 may be annealed at a temperature about 350° C. Specifically, the annealing process may be performed at a temperature between about 350° C. to 450° C. The annealing process may maximize properties of the pinning layer 118 and/or the tunnel insulating layer 130.

A magnesium oxide layer may be used as the tunnel insulating layer 130 and may be annealed at a temperature of about 360° C. or higher for improved characteristics. Because the tunnel insulating layer 130 may be formed of a magnesium oxide layer annealed at a temperature of about 360° C. or higher, an MTJ pattern that may be formed at a later process may have very-high magnetoresistance.

Referring to FIG. 7, the MTJ layer 136 may be patterned to form an MTJ pattern 136a on the electrode 116. The MTJ pattern 136a may include a sequentially stacked lower magnetic pattern 128a, a tunnel insulating pattern 130a, an upper magnetic pattern 132a, and a capping pattern 134a. If the MTJ layer 136 includes the anti-oxidation conductive layer 135, the MTJ pattern 136a may further include an anti-oxidation conductive pattern 135a disposed on the capping pattern 134a.

The lower magnetic pattern 128a may include a sequentially stacked pinning pattern 118a, a first pinned pattern 122a, a reversing pattern 124a, and a second pinned pattern 126a. If the pinning layer 118 is formed between the first pinned layer 122 and the diffusion barrier layer 120, the lower magnetic pattern 128a may further include a diffusion barrier pattern 120a disposed between the pinning pattern 118a and the first pinned pattern 122a.

The MTJ pattern 136a may have a rectangular two-dimensional shape. This shape facilitates the arrangement of a magnetization direction of the upper magnetic pattern 132a. That is, the magnetization direction of the upper magnetic pattern 132a may change to be parallel to a longitudinal direction of the MTJ pattern 136a by the external magnetic fields generated by the digit line 108a and the bit line 144.

An upper insulating layer 138 may be formed on an entire surface of the substrate 100. The upper insulating layer 138 may be formed of a silicon oxide layer. The upper insulating layer 138 may be patterned to form a line contact hole 140 that exposes the capping pattern 134a. If the MTJ pattern 136a includes the anti-oxidation conductive layer 135a, the line contact hole 140 may expose the anti-oxidation conductive layer 135a. A line plug may be formed to fill the line contact hole 140.

A bit line 144 may be formed on the upper insulating layer 138 to intersect the digit line 108a. The bit line 144 may be electrically connected to the line plug 142. If the line plug 142 is omitted, the bit line 144 may extend downward to fill the line contact hole 140.

Alternatively, the bit line 144 may be connected to the capping pattern 134a. In this case, formation of the line contact hole 140 is not necessary. Accordingly, the formation of the line plug 142 may also be unnecessary. In this method, after the formation of the upper insulating layer 138, the upper insulating layer 138 may be patterned until an upper surface of the capping pattern 134a is exposed. Thereafter, a bit line 144 may be formed. In this case, the bit line 144 may be directly connected to the exposed capping pattern 134a or the anti-oxidation conductive pattern 135a.

As described above, the capping pattern may be formed of zirconium (Zr), yttrium (Y), and hafnium (Hf), which may be resistant to reacting with the upper magnetic pattern 132a at a temperature of about 350° C. or higher. Accordingly, even if the MTJ pattern 136a is annealed at a temperature of about 350° C. or higher, the property degradation of the upper magnetic pattern 132a may be minimized. Consequently, an MRAM device property degradation may be prevented. Also, the tunnel insulating pattern may be formed of a magnesium oxide layer that requires a high-temperature annealing process. Accordingly, it may be possible to improve the magnetic resistance of the MTJ pattern and the sensing margin of the MRAM device. In addition, it may be possible to improve the process temperature margin of the MRAM device during manufacturing processes including succeeding processes after the formation of MTJ pattern.

It will be apparent to those skilled in the art that various modifications and variations may be made to example embodiments of the present invention. Thus, it is intended that the example embodiments of the present invention cover those modifications and variations.

What is claimed is:

1. A semiconductor memory device, comprising:
   a digit line disposed on a substrate;
   an intermediate insulating layer covering the digit line;
   a magnetic tunnel junction (MTJ) pattern disposed on the intermediate insulating layer and over the digit line, the MTJ pattern including a sequentially stacked lower magnetic pattern, an upper magnetic pattern, and a capping pattern, wherein the capping pattern does not react with the upper magnetic pattern at a temperature above about 280° C.; and
   a bit line connected to the capping pattern and disposed to intersect the digit line.

2. The device of claim 1, wherein the capping layer is formed of at least one material selected from a group consisting of zirconium, yttrium, and hafnium.

3. The device of claim 1, wherein the MTJ pattern further includes a tunnel insulating layer between the stacked lower magnetic pattern and the upper magnetic pattern, and an anti-oxidation conductive pattern disposed on the capping pattern and connected to the bit line.

4. The device of claim 3, wherein the tunnel insulating layer includes a magnesium oxide layer or an aluminum oxide layer.

5. The device of claim 1, further including a Metal-Oxide-Semiconductor (MOS) transistor disposed beneath the digit line.

6. The device of claim 1, wherein the lower magnetic pattern includes:
   a pinning pattern;
   a first pinned pattern disposed on the pinning pattern;
   a reversing pattern disposed on the first pinned pattern; and
   a second pinned pattern disposed on the reversing pattern,
   wherein a magnetization direction of the first pinned pattern is fixed to a first direction by the pinning pattern, and the reversing pattern fixes a magnetization direction of the second pinned pattern in a second direction with respect to the fixed first magnetization direction of the first pinned pattern.

7. The device of claim 6, wherein a thickness of the first pinned pattern is greater than a thickness of the second pinned pattern.

8. The device of claim 6, wherein the lower magnetic pattern further includes a diffusion baffler pattern interposed between the pinning pattern and the first pinned pattern to prevent outward diffusion of elements in the pinning pattern.

9. The device of claim 6, wherein the first pinned pattern includes an amorphous ferromagnet.

10. The device of claim 8, wherein the first pinned pattern includes an amorphous ferromagnet.

11. The device of claim 1, wherein the MTJ pattern is formed in a rectangular shape, and a magnetization direction of the upper magnetic pattern is parallel to a longitudinal direction of the MTJ pattern when magnetic fields are generated by the digit line and the bit line.

12. The device of claim 1, further comprising:
   a lower insulating layer interposed between the digit line and the substrate;
   an electrode interposed between the MTJ pattern and the intermediate insulating layer;
   a conductive plug disposed in the intermediate insulating layer; and
   an upper insulating layer disposed above the intermediate insulating layer and surrounding the MTJ pattern,
   wherein the MTJ pattern is connected at a first side of the electrode, and the conductive plug is connected to a second side of the electrode.

* * * * *